US012166145B2

United States Patent
Sampayan et al.

(10) Patent No.: US 12,166,145 B2
(45) Date of Patent: Dec. 10, 2024

(54) DIFFUSE DISCHARGE CIRCUIT BREAKER

(71) Applicants: Lawrence Livermore National Security, LLC, Livermore, CA (US); Opcondys, Inc., Manteca, CA (US)

(72) Inventors: Stephen E. Sampayan, Manteca, CA (US); Kristin C. Sampayan, Manteca, CA (US)

(73) Assignees: Lawrence Livermore National Security, LLC, Livermore, CA (US); Opcondys, Inc., Manteca, CA (US)

( * ) Notice: Subject to any disclaimer, the term of this patent is extended or adjusted under 35 U.S.C. 154(b) by 85 days.

(21) Appl. No.: 17/397,699

(22) Filed: Aug. 9, 2021

(65) Prior Publication Data

US 2022/0045232 A1 Feb. 10, 2022

Related U.S. Application Data

(60) Provisional application No. 62/706,332, filed on Aug. 10, 2020.

(51) Int. Cl.
*H01L 31/16* (2006.01)
*H01H 89/00* (2006.01)

(52) U.S. Cl.
CPC .......... *H01L 31/161* (2013.01); *H01H 89/00* (2013.01)

(58) Field of Classification Search
CPC ....... H01L 31/161; H01L 31/09; H01H 89/00; H01H 33/125; H01H 33/596; H01H 33/6661; H03K 17/78

(Continued)

(56) References Cited

U.S. PATENT DOCUMENTS 4,086,459 A * 4/1978 Rich ............... H01H 33/66
218/126
5,341,017 A 8/1994 Booth et al.
(Continued)

FOREIGN PATENT DOCUMENTS

CN 101820129 A * 9/2010
CN 103681969 B 5/2016
(Continued)

OTHER PUBLICATIONS

O. A. Ciniglio, D. P. Carroll and H. Mehta, "The application of photoconductive switches in HVDC circuit interruption," in IEEE Transactions on Power Delivery, vol. 5, No. 1, pp. 460-466, Jan. 1990 (Year: 1990).*

(Continued)

*Primary Examiner* — Thienvu V Tran
*Assistant Examiner* — Sreeya Sreevatsa
(74) *Attorney, Agent, or Firm* — Perkins Coie LLP

(57) ABSTRACT

Devices, methods and techniques are disclosed to interrupt a fault current in a high-voltage direct-current circuit. In one example aspect, a device includes a mechanical switch including a pair of contacts configured to be positioned apart upon activation of the circuit breaker, and a photoconductive component connected in parallel with the mechanical switch. The photoconductive component is configured to establish a current upon activation of the circuit breaker. The photoconductive component comprises a crystalline material positioned to receive a pulsed light signal from a laser light source, and a pair of electrodes coupled to the crystalline material and configured to allow an electric field to be established across the crystalline material to generate the current.

17 Claims, 13 Drawing Sheets

(58) Field of Classification Search
USPC .......................................................... 307/113
See application file for complete search history.

(56) References Cited

U.S. PATENT DOCUMENTS

| | | |
|---|---|---|
| 8,258,632 B1 | 9/2012 | Sullivan et al. |
| 8,563,930 B2 | 10/2013 | Harris et al. |
| 9,142,339 B2 | 9/2015 | Sampayan |
| 9,468,087 B1 | 10/2016 | Joshi |
| 9,748,859 B2 | 8/2017 | Sampayan |
| 11,366,401 B2 | 6/2022 | Sampayan et al. |
| 2007/0092812 A1 | 4/2007 | Caporaso et al. |
| 2009/0261258 A1 | 10/2009 | Harris et al. |
| 2010/0276594 A1 | 11/2010 | Rafailov et al. |
| 2010/0282949 A1 | 11/2010 | Caporaso |
| 2011/0101376 A1 | 5/2011 | Caporaso et al. |
| 2011/0266556 A1 | 11/2011 | Leonard et al. |
| 2013/0056842 A1 | 3/2013 | Sullivan et al. |
| 2013/0328058 A1 | 12/2013 | Nelson |
| 2013/0328146 A1 | 12/2013 | Nelson |
| 2013/0342306 A1 | 12/2013 | Sampayan |
| 2014/0038321 A1 | 2/2014 | Caporaso |
| 2014/0263976 A1 | 9/2014 | Sampayan |
| 2014/0263979 A1 | 9/2014 | Guethlein |
| 2014/0270777 A1 | 9/2014 | Sampayan |
| 2014/0284451 A1 | 9/2014 | Sampayan et al. |
| 2014/0312741 A1 | 10/2014 | Werne et al. |
| 2015/0028674 A1 | 1/2015 | Sampayan |
| 2015/0155279 A1 | 6/2015 | Konrath et al. |
| 2015/0207015 A1 | 7/2015 | Nunnally |
| 2016/0028222 A1* | 1/2016 | Johansson ............... H02H 3/021 361/91.1 |
| 2016/0233370 A1 | 8/2016 | Jiang et al. |
| 2017/0084365 A1* | 3/2017 | Nguyen ................. H01S 5/0615 |
| 2018/0013028 A1 | 1/2018 | Nelson et al. |
| 2018/0084617 A1 | 3/2018 | Zhang et al. |
| 2018/0190628 A1 | 7/2018 | Male et al. |
| 2018/0190855 A1 | 7/2018 | Male |
| 2018/0284565 A1 | 10/2018 | Sullivan |
| 2019/0355561 A1 | 11/2019 | Sampayan |
| 2020/0356016 A1 | 11/2020 | Sampayan et al. |

FOREIGN PATENT DOCUMENTS

| | | |
|---|---|---|
| EP | 2490263 A2 | 8/2012 |
| JP | H0745857 A | 2/1995 |
| JP | H07045857 | 2/1995 |
| JP | 63318193 A | 12/1998 |
| JP | 2009513017 A | 3/2009 |
| JP | 2011518442 A | 6/2011 |
| WO | 03050519 A1 | 6/2003 |
| WO | 2007120191 A2 | 10/2007 |
| WO | 2009129512 A2 | 10/2009 |
| WO | 2011098029 A1 | 8/2011 |
| WO | 2011118934 A2 | 9/2011 |
| WO | 2016088952 A1 | 6/2016 |
| WO | 2019059932 A1 | 3/2019 |

OTHER PUBLICATIONS

C. P. Triaros, D. P. Carroll and F. A. Lindholm, "Photoconductive switches for AC circuit protection," in IEEE Transactions on Electron Devices, vol. 37, No. 12, pp. 2526-2531, Dec. 1990 (Year: 1990).*

K. Sampayan and S. Sampayan, "Wide Bandgap Photoconductive Switches Driven by Laser Diodes as a High-Voltage Mosfet Replacement for Bioelectrics and Accelerator Applications," 2019 IEEE Pulsed Power & Plasma Science (PPPS), Orlando, FL, USA, 2019, pp. 1-4, doi: 10.1109/PPPS34859.2019.9009741. (Year: 2019).*

C. P. Triaros, D. P. Carroll and F. A. Lindholm, "Photoconductive switches for AC circuit protection," in IEEE Transactions on Electron Devices, vol. 37, No. 12, pp. 2526-2531, Dec. 1990, doi: 10.1109/16.64529. (Year: 1990).*

J. Hayes, K. George, P. Killeen, B. McPherson, K. J. Olejniczak and T. R. McNutt, "Bidirectional, SiC module-based solid-state circuit breakers for 270 Vdc MEA/AEA systems," 2016 IEEE 4th Workshop on Wide Bandgap Power Devices and Applications (WiPDA), Fayetteville, AR, USA, 2016, pp. 70-77 (Year: 2016).*

K. Sampayan and S. Sampayan, "A 20 kV, 125 kHz Photonically Driven Power MOSFET-like Device," 2019 IEEE Energy Conversion Congress and Exposition (ECCE), Baltimore, MD, USA, 2019, pp. 4546-4550, doi: 10.1109/ECCE.2019.8912299 (Year: 2019).*

E. Majda-Zdancewicz, M. Suproniuk, M. Pawłowski, M. Wierzbowski, Current state of photoconductive semiconductor switch engineering, Opto-Electronics Review, vol. 26, Issue 2, 2018, pp. 92-102, ISSN 1230-3402, https://doi.org/10.1016/j.opelre.2018.02.003 (Year: 2018).*

O.A.Ciniglio, D.P.Carroll, The application of photoconductive switches in HVDC circuit interruption, IEEE transactions on power delivery, vol. 5, No. 1, Jan. 1990 (Year: 1990).*

Callavik, Magnus, et al., "The Hybrid HVDC Breaker," An innovation breakthrough enabling reliable HVDC grids, ABB Grid Systems, Technical Paper, 2012.

Sampayan, Stephen E., et al., "Recovery Properties of Vacuum Spark Gaps," IEEE Trans Plasma Sci., v.17, No. 6, p. 889 (1989).

Chowdhury, S. et al., "4H—SiC n-channel DMOS IGTBs on (0001) and (000-1) Oriented Lightly Doped Free-standing Substrates." Materials Sciences Forum, vol. 858, pp. 954-957, 2016.

Extended European Search Report mailed Mar. 15, 2021 in European Patent Application No. 17925559.1, 9 pages.

Hettler, C. et al., "Carrier lifetime studies of semi-insulating silicon carbide for photoconductive switch applications," Power Modulator and High Voltage Conference, May 23, 2010, pp. 34-37.

International Search Report and Written Opinion received in the application No. PCT/US2017/053066, mailed on Jun. 21, 2018, 12 pages.

Ordonez, J.S. et al., "Long-term Adhesion Studies of Polyimide to Inorganic and Metallic Layers." Mater. Res. Soc. Proc., vol. 1466, 2012, 7 pages.

Sullivan, J.S., "High power operation of a nitrogen doped vanadium compensated, 6H—SiC extrinsic photodoncudtive switch," Applied Physics Letters, AIP Publishing LLC, vol. 104, No. 17, Apr. 28, 2014.

Watanabe, N. et al., "6.5 kVn-Channel $h-SiC IGBT with Low Switching Loss Achieved by Extremely Thin Drift Layer." Materials Science Forum, vol. 858, pp. 939-944, 2016.

Office Action mailed Mar. 28, 2022 for Japanese Patent Application No. 2020-538521.

Office Action mailed Mar. 31, 2022 for Canadian Patent Application No. 3,076,468.

Tamulaitis, G., et al., "Carrier lifetime in conductive and vanadium-doped 6H—SiC substrates," Applied Physics Letters, vol. 84, No. 3, 2004.

Triaros, Christos P., et al., "Photoconductive Switches for AC Circuit Protection," IEEE Transactions on Electron Devices, vol. 37, No. 12, pp. 2526-2531, 1990.

O. A. Ciniglio, D. P. Carroll and H. Mehta, "The application of photoconductive switches in HVDC circuit interruption," in IEEE Transactions on Power Delivery, vol. 5, No. 1, pp. 460-466, Jan. 1990, doi: 10.1109/61.107313.

J. S. Sullivan and J. R. Stanley, "6H—SiC photoconductive switches triggered at below bandgap wavelengths," in IEEE Transactions on Dielectrics and Electrical Insulation, vol. 14, No. 4, pp. 980-985, Aug. 2007, doi: 10.1109/TDEI.2007.4286537.

Nunnally, William C., "High-Power Microwave Generation Using Optically Activated Semiconductor Switches," IEEE Transactions on Electron Devices vol. 37, No. 12, p. 2439-2448, 1990.

* cited by examiner

DIFFUSE DISCHARGE CIRCUIT BREAKER

CROSS REFERENCE TO RELATED APPLICATIONS

This patent document claims priority to, and benefits of, U.S. Provisional Patent Application No. 62/706,332 entitled "Diffuse Discharge Circuit Breaker" and filed Aug. 10, 2020. The entire contents of the before-mentioned patent application are incorporated by reference as part of the disclosure of this patent document.

TECHNICAL FIELD

This document generally relates to circuit breakers, and specifically ultra-high-, high-, and medium-voltage Direct Current (DC) circuit breakers.

BACKGROUND

A circuit breaker is an electrical switch designed to protect an electrical circuit from damage caused by excess current from an overload or short circuit. Its basic function is to interrupt current flow, typically after a fault is detected.

SUMMARY

Devices, methods and techniques are disclosed to provide a direct current high-voltage circuit breaker, which among other features and benefits, is capable of interrupting the current under ultra-high voltages within nanoseconds with reduced complexity and size.

In one example aspect, an apparatus includes a mechanical switch including a pair of contacts configured to be positioned apart upon activation of the circuit breaker, and a photoconductive component connected in parallel with the mechanical switch. The photoconductive component configured to establish a current upon activation of the circuit breaker. The photoconductive component comprises a crystalline material positioned to receive a pulsed light signal from a laser light source. The crystalline material is doped with a dopant that forms a mid-gap state within a bandgap of the crystalline material to achieve, upon excitation of the crystalline material by the pulsed light signal, a recombination time that is at least one order of magnitude smaller than a characteristic time of a highest frequency component of an electrical signal controlling the light source. The photoconductive component also includes a pair of electrodes coupled to the crystalline material and configured to allow an electric field to be established across the crystalline material to generate the current.

In some embodiments, the photoconductive component further includes an optical fiber between the light source and the crystalline material. The light source can be configured to emit a pulsed laser signal having a pulse time between $10^{-8}$ to $10^{-4}$ seconds. For example, the DC circuit breaker can include a laser configured to produce the pulsed laser signal that comprises a square pulse or a rectangular pulse. In some embodiments, the mechanical switch is configured to diffuse discharge caused by a fault current. For instance, the mechanical switch can include one of a rod array vacuum breaker, a non-rod array breaker a series saturable reactor, or a combination thereof. The photoconductive component can be configured to establish the current in both directions parallel to the pair of contacts. The apparatus in some embodiments also includes a resonant circuit configured to store energy to enable generation of the current upon the electric field being established across the crystalline material, wherein the resonant circuit includes at least an inductor and a capacitor. The apparatus can further include a convective cooling configuration coupled to the photoconductive component and configured to dissipate heat generated from the photoconductive component.

In another example aspect, a method for operating a circuit breaker that is part of an electrical circuitry includes opening a pair of contacts upon receiving an indication that the circuit breaker is to be activated, generating a pulse by a laser light source coupled to a photoconductive component that is connected in parallel with the pair of contacts, and receiving the pulse from the laser light source at a crystalline material of the photoconductive component. The crystalline material is coupled to a pair of electrodes to allow an electric field to be established across the crystalline material upon receiving the pulse. The crystalline material is doped with a dopant that forms a mid-gap state within a bandgap of the crystalline material to achieve, upon excitation of the crystalline material by the pulsed light signal, a recombination time that is at least one order of magnitude smaller than a characteristic time of a highest frequency component of an electrical signal controlling the laser light source. Upon receiving the pulse by crystalline material, at least part of a current that flows through the electrical circuitry to flow through the photoconductive component.

The above and other aspects and features of the disclosed technology are described in greater detail in the drawings, the description and the claims.

DETAILED DESCRIPTION

A circuit breaker is a switching device that is used to control the flow of electricity, and in the context of electricity distribution systems, it controls the electricity flow from the overall grid to a specific electrical system. The main task of a circuit breaker is to interrupt fault currents and to isolate faulted parts of the system. When the fault occurs in the system, the mechanical contacts of the circuit breaker are pulled apart and thus the circuit is opened.

An electric arc, or arc discharge, is an electrical breakdown of a gas that produces an electrical discharge. The current usually passes through non-conductive media and creates a plasma which sustains the discharge. An arc discharge can be formed either during the separation of two electrical contacts with different electric potentials or in a spark breakdown of the gap between the two contacts. An Alternating Current (AC) circuit breaker easily interrupts the arc at natural current zero in the AC wave. At zero current, the energy to be interrupted is also zero.

Figure 1:
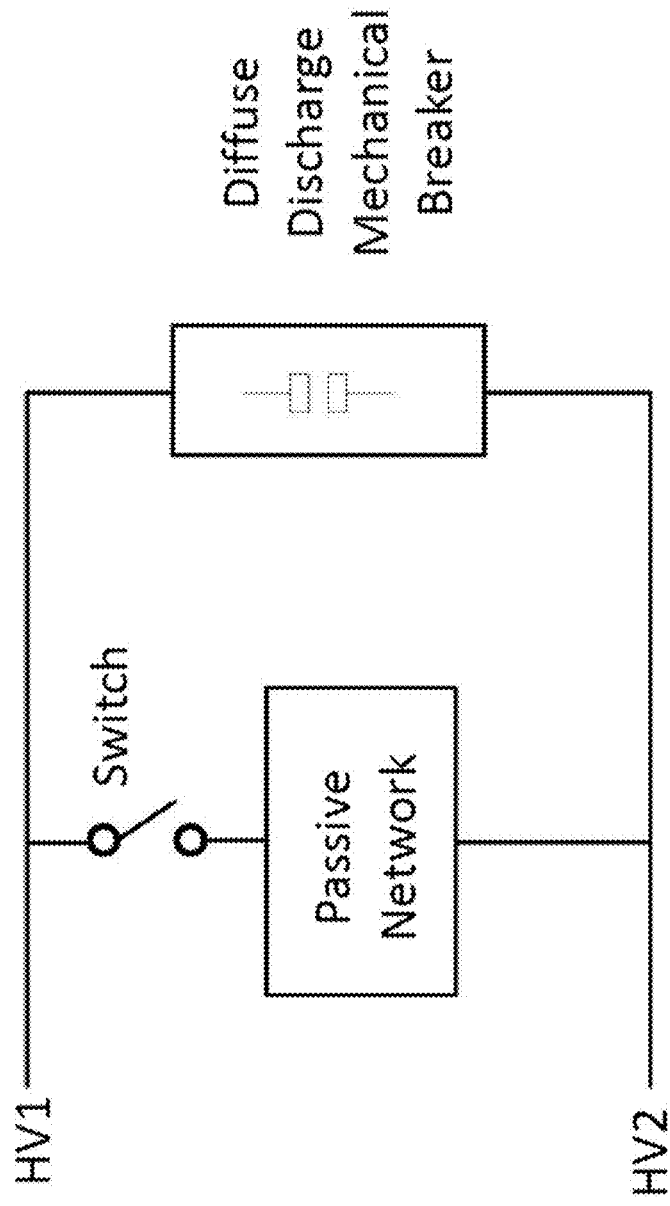
FIG. 1 illustrates an example configuration of a parallel circuit with a diffuse discharge breaker.

With Direct Current (DC) circuit breakers, the problem is more complex as the DC waveform does not have natural current zeros. One way to implement improved DC circuit breakers is to generate an artificial current zero by applying a reverse voltage across the contacts, thereby extinguishing the arc. Another approach is to introduce a parallel circuit to divert the current through an auxiliary switch, thereby achieving an artificial current zero. FIG. 1 illustrates an example configuration of a parallel circuit with a diffuse discharge breaker. In this example, a passive circuit network (e.g., a resonant passive network) and an auxiliary switch are combined with a mechanical circuit breaker for breaking of the voltage across the current circuits. Under normal operating conditions, the contacts of the circuit breaker are closed. For interrupting the main circuit current, the mechanical contacts of the discharge breaker are pulled open. For example, in some embodiments, the contacts of a rod array vacuum breaker open at fault. The auxiliary switch closes to divert the current into the parallel circuit, thereby creating the artificial current zero and extinguishing the discharge. The passive network can absorb energy without greatly adding to the voltage across the main contact.

It has been observed that forced arc interruption can produce high transient recovery voltage and restrike without arc interruption, and ultimate destruction of the breaker contacts. Furthermore, as the current rises when the fault occurs, at high current values the arc can change to a constricted form with an anode spot. A constricted arc that remains on one spot for too long can thermally overstress the contacts to such a degree that the deionization of the contact zone at current zero can no longer be guaranteed.

Figure 2:
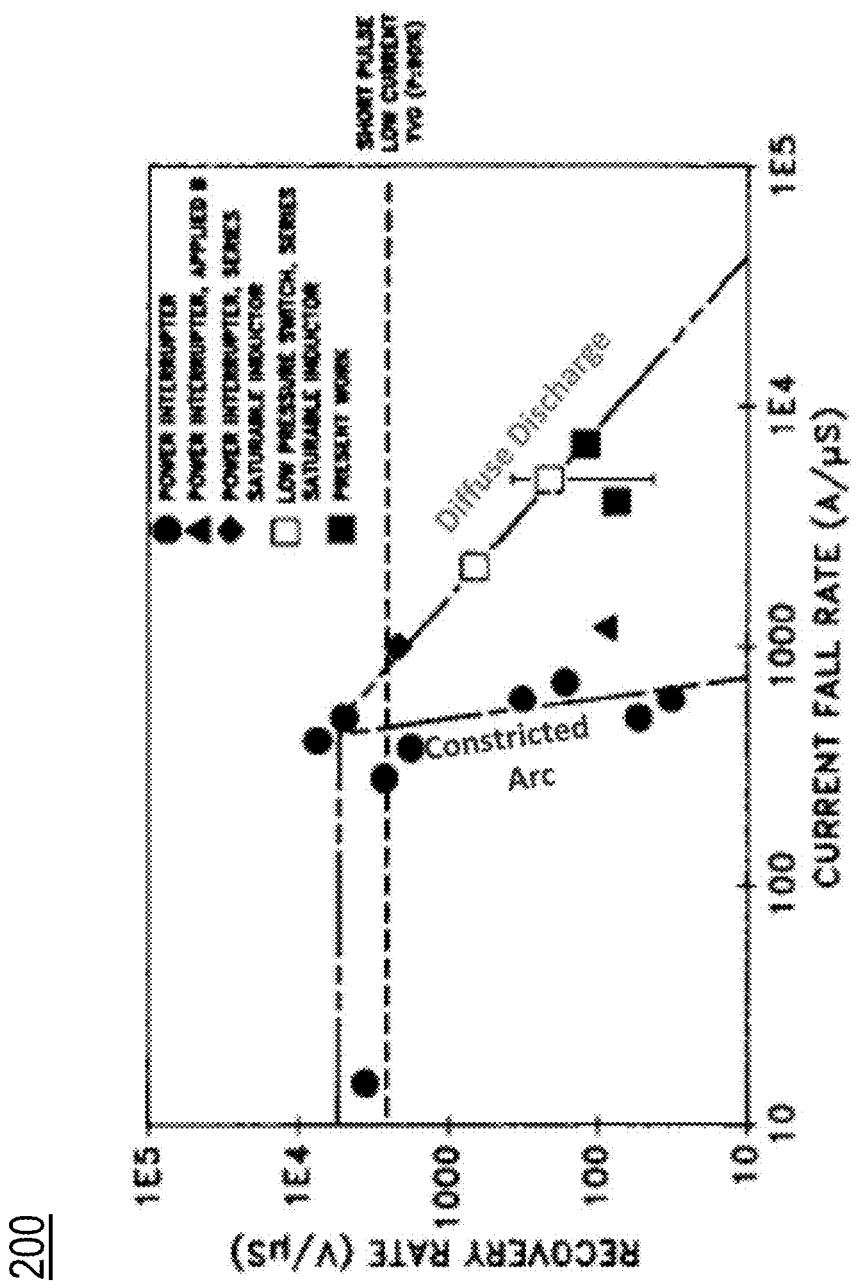
FIG. 2 illustrates example properties of vacuum spark gaps.

The problem of prevention of restrikes and constricted arc can be intense in DC circuit breakers. The circuit breaker must be capable of withstanding the steep surge of the restriking voltage across breaker terminals. FIG. 2 illustrates example recovery properties of vacuum spark gaps. It is noted that natural vapor from the arc has a fixed dissipation time. As shown in FIG. 2, a steep reduction of the recovery rate can be observed for constricted arc. By leveraging controlled switching elements (e.g., diffuse discharge), a tailored fall time can be achieved to match neutral decay and minimize restrike.

To address the various design problems, conventional DC circuit breakers are often complex. For example, some types of high-voltage DC breakers include several breaker cells stacked together. Each stack is composed of dozens of serially connected Insulated Gate Bipolar Transistor (IGBT) breaker positions. Furthermore, due to the large current stress during current breaking, a mechanical design with low stray inductance is required. Such DC circuit breakers often require large isolation space, leading to significant sizes of the circuit breakers (e.g., similar to aircraft hangars). Furthermore, the operating time for conventional DC circuit breakers is still within the range of several milliseconds to several tens of milliseconds, making them too slow for reliable ultra-high-voltage grid (e.g., voltage in the order of megavolts).

This patent document discloses techniques that can be implemented in various embodiments to provide a DC high-voltage circuit breaker capable of interrupting the current on the millisecond time scale under ultra-high voltage (e.g., ~1 MV) with the initiating of the commutation of the breaker within 10-50 nanoseconds. The time delays inherent in conventional circuitry can be overcome by the natural electrical isolation of the drive used with photoconductive switches. As a result, near simultaneous commutating can be realized, except being limited by the speed of light transit over the required stand-off distance of the switches themselves. For instance, transmission lines of 750 to 1000 kV require a safety distance of 45 feet between the transmission line and ground. At a speed of light of approximately 1 ns/ft in air, a photoconductive device can initiate commutation in 45 nanoseconds.

Figure 3:
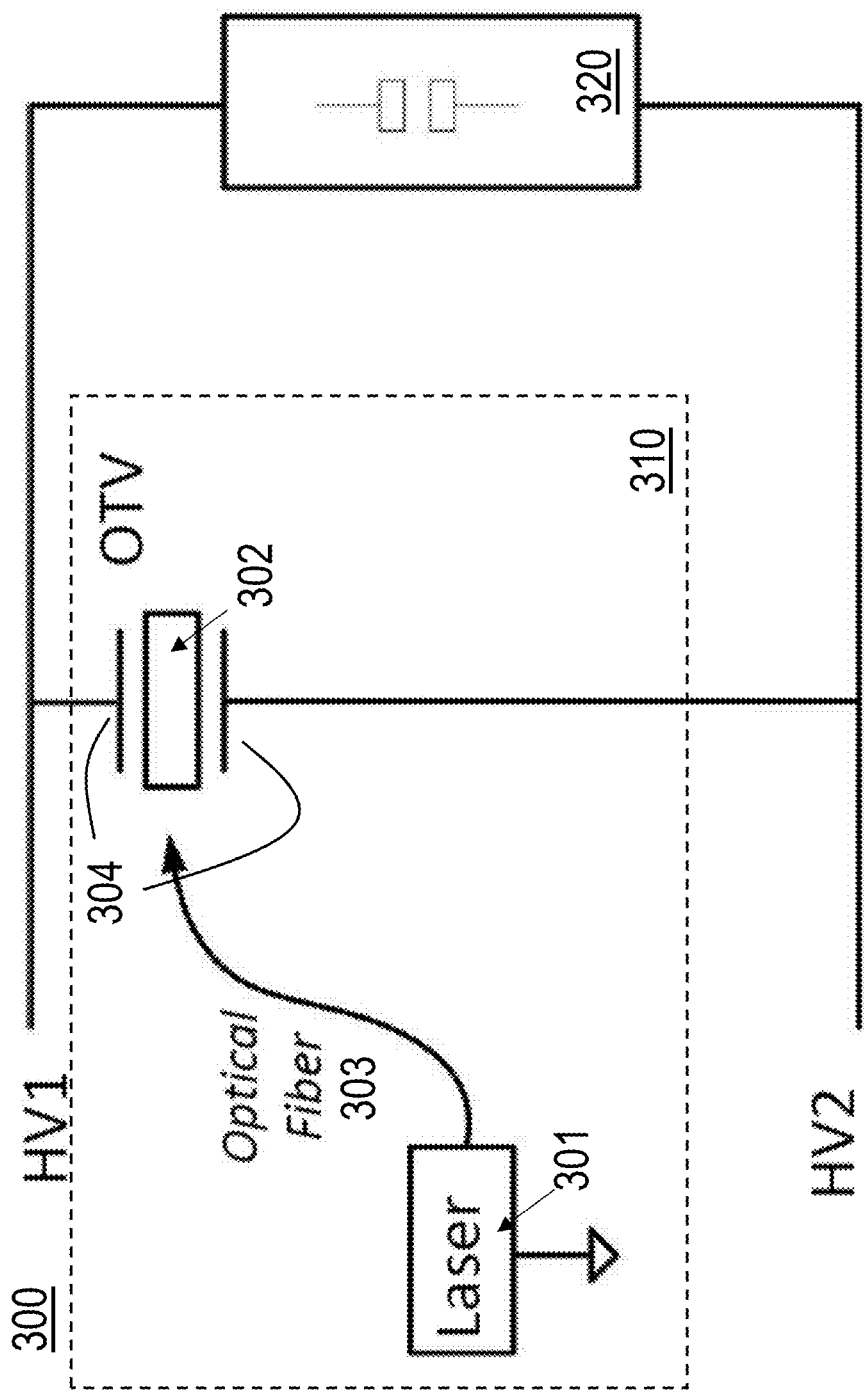
FIG. 3 illustrates an example configuration of circuit breaker system in accordance with one or more embodiments of the present technology.

In particular, properties of optically excited wide bandgap or crystalline materials can be used to construct a high-voltage, fast-response circuit breaker system with reduced complexity and size. FIG. 3 illustrates an example configuration of a circuit breaker system in accordance with one or more embodiments of the present technology. As shown in FIG. 3, a photoconductive component 310 is combined with a mechanical circuit breaker 320 for breaking of ultra-high-, high-, and medium-voltage DC circuits. In a typical scenario, when a fault occurs in the DC circuit (e.g., one or more electrical components short to each other or to the ground), fault current—the current that flows through the circuit during the fault—can be detected. Upon detection of the fault current, the contacts of the mechanical circuit breaker 320 are pulled apart to open the circuits, and the photoconductive component establishes a parallel circuit to divert the current so as to create an artificial current zero. Fault current detection is provided as an example. It is understood, however, that the disclosed breakers can be activated via other triggering conditions, such as receiving an indication from a user, or another component. Using the configuration shown in FIG. 3, the circuit breaker system is capable of handling ultra-high- and high-voltages in a range of 50 kV to over 100 kV. Even higher voltages can be achieved by placing these devices in series. The circuit breaker system is also suitable for handling medium-voltage DC circuits with voltage levels around 20-40 kV and can offer faster response time as compared to the existing circuit breaker system. The mechanical breaker 320 can be implemented using, for example, a rod array vacuum breaker, a non-rod array breaker, a series saturable reactor, or combination thereof. In one example, a series saturable reactor, where the magnetic core can be deliberately saturated by a direct electric current in a control winding, is added to the breaker circuit to ensure that the discharge remains diffuse so as to mitigate constricted arc formation and to minimize restrike.

The photoconductive component 310 includes a light source 301 (e.g., a laser) and a bulk crystalline material 302 (e.g., silicon carbide). The crystalline material can be doped with a dopant (e.g., Vanadium, Nitrogen, Aluminum, or Boron) to form a mid-gap state within a bandgap of the crystalline material to achieve a recombination time of a predetermined value upon excitation by light. In some implementations, the crystalline material 302 can be excited by the light via an optical fiber 303. A pair of electrodes 304 can be coupled to the crystalline material 302 to allow an electric field to be established across the crystalline material 302. In some embodiments, the photoconductive component can be implemented as described in U.S. Pat. No. 8,563,930, titled "SYSTEM AND METHOD OF MODULATING ELECTRICAL SIGNALS USING PHOTOCONDUCTIVE WIDE BANDGAP SEMICONDUCTORS AS VARIABLE RESISTORS" and filed on Apr. 17, 2009, U.S. Pat. No. 9,142,339, titled "COMPACT OPTICAL TRANSCONDUCTANCE VARISTOR" and filed on Jun. 26, 2013, and U.S. Pat. No. 9,748,859, titled "FOUR-TERMINAL CIRCUIT ELEMENT WITH PHOTONIC CORE" and filed on Jul. 28, 2014, the contents of the before-mentioned patents are incorporated by reference as part of the disclosure of this patent document.

Power semiconductor devices such as bipolar junction and field effect transistors exploit a transconductance property. The behavior of the current, I, is related to a quantity defined as the transconductance. It takes the general form: $g_m = \Delta I_{out}/\Delta \xi_{in}$, where $\xi_{in}$ is the controlling input, $I_{out}$ is the output current, and 4 denotes a change in the parameter. In field effect devices, $\xi_{in}$ is the voltage applied to the gate. Amplification is then $V_{out} = V_g g_m Z_o$, where $V_g$ is the input voltage and $Z_o$ is the load impedance. These simple relationships serve as the basic foundation for electronic circuitry. Transconductance has been observed in junction devices fabricated from Ge, Si, ZnO, Graphene, carbon nanotubes, InAs nanowire channels, GaN/InAlN, organic semiconductors, gel-solution gated structures and others.

Figure 4A:
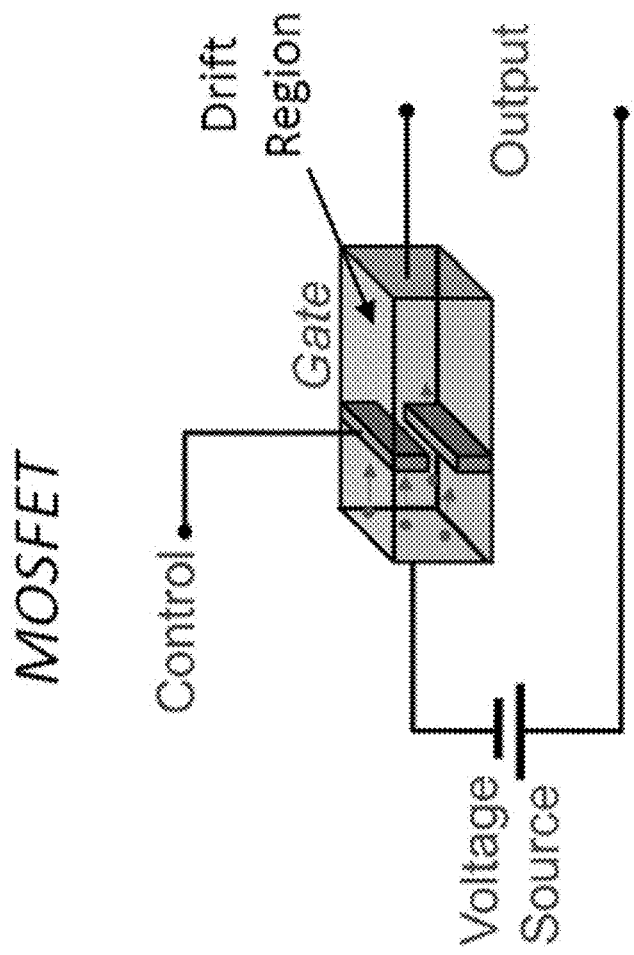
FIG. 4A shows a schematic diagram of an example metal-oxide-semiconductor field-effect transistor (MOSFET).

FIG. 4A shows a schematic diagram of an example metal-oxide-semiconductor field-effect transistor (MOSFET) to facilitate the description that follows. When a voltage is applied between two opposing terminals (e.g., a voltage source and an output), a third intervening terminal (e.g., a gate) can be used to control the current, I, through the device. The action at the control electrode is delayed at the drain by the carrier transit time. This delay is proportional to $x/\mu E$, where x is the drift length, $\mu$ is the carrier mobility, and E is the applied electric field. Because the applied field is limited by intrinsic material properties, such devices are inherently slow for handling high voltages and can lead to high energy loss.

Figure 4B:
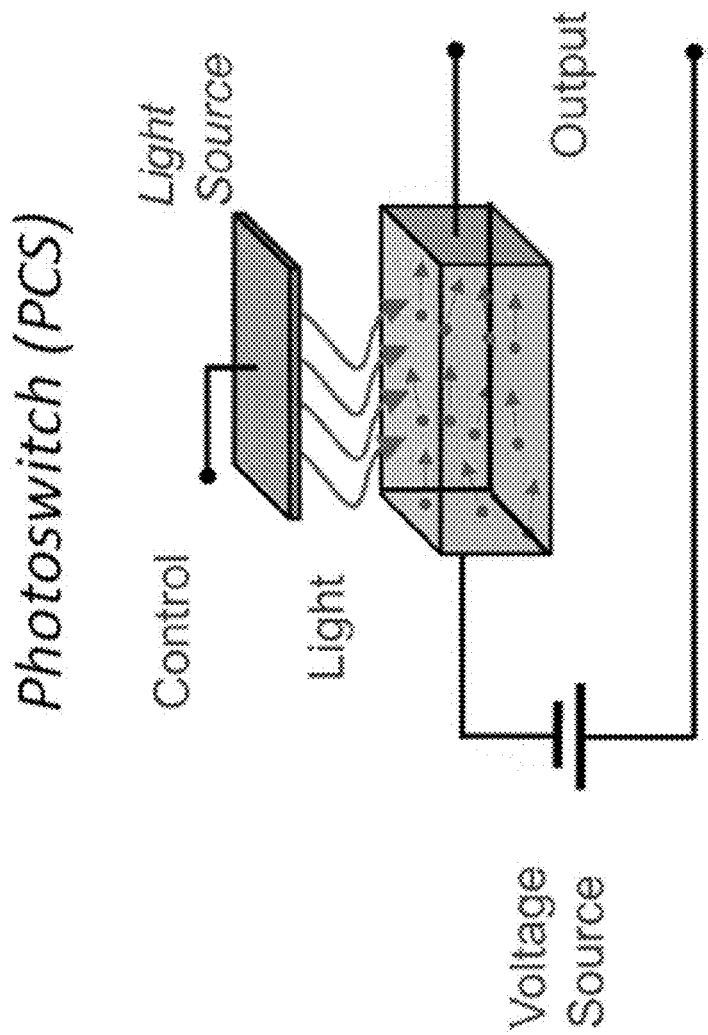
FIG. 4B shows a schematic diagram of an example photoconductive device that can be implemented in one or more embodiments of the present technology.

Transconductance has been observed in photoconductive devices. In particular, direct control of carriers by photons has distinct advantages. For instance, if the illumination is transverse to the current, bulk control is fundamentally limited only by speed of light transit time. Transition losses are therefore significantly lower as compared to a standard junction device. FIG. 4B shows a schematic diagram of an example photoconductive device that can be implemented in one or more embodiments of the present technology. A photoconductive device is an electrical device that operates based on the optical conductivity of a material, e.g., an increase in the electrical conductance as a consequence of irradiation with light.

One way in which a photoconductive device differs from a junction device is that the transconductance property in a photoconductive device is only an approximation. Although the charge carriers similarly respond to an equivalent $\xi_{in}'$, as the controlling input, the carriers decay based on the physical dynamics and can be intentionally designed into the material crystal lattice. For most materials, the conductance is very low (e.g., high resistance around $10^8$ ohm) in the quiescent state. In correctly designed materials, however, optical pumping can excite charge carriers into the conduction band, rendering the material conductive. Controlled carrier decay then results from the physical recombination or "trapping" based on the designed material crystal lattice of the material.

The transconductance of a photoconductive material can be obtained as follows. First, a general expression for the behavior of the charge carrier density, which is proportional to the conductance, g(t), can be described using the continuity equation:

$$\frac{dg(t)}{dt} + \frac{g(t)}{\tau} = \frac{g_o}{\tau} S(t) \qquad \text{Eq. (1)}$$

Here, $\tau$ is the recombination time, $g_o$ is the maximum conductivity, and S(t) is the normalized optical intensity. Eq. (1) describes the excitation of charge carriers by function S(t) and the subsequent trapping with a time constant $\tau$.

The general solution to Eq. (1) from t=0 is:

$$g(t) \propto e^{-\frac{t}{\tau}} \int_0^t S(t') e^{\frac{t'}{\tau}} dt' \qquad \text{Eq. (2)}$$

Therefore, the carriers within a photoconductive material under an optical pump can be described by the above integral equation. As an example, with a prompt excitation impulse "spike," $\delta(t)$, the integral for g(t) is an exponential decay. But for slowly varying S(t) compared to $\tau$, the integral for g(t) reduces to being proportional to S(t). Therefore, $\xi_{in}'$ is the controlling input that is inversely proportional to $$\frac{1}{S(t)'}; \xi_{in}' \to \frac{1}{S(t)}.$$

Figure 5A:
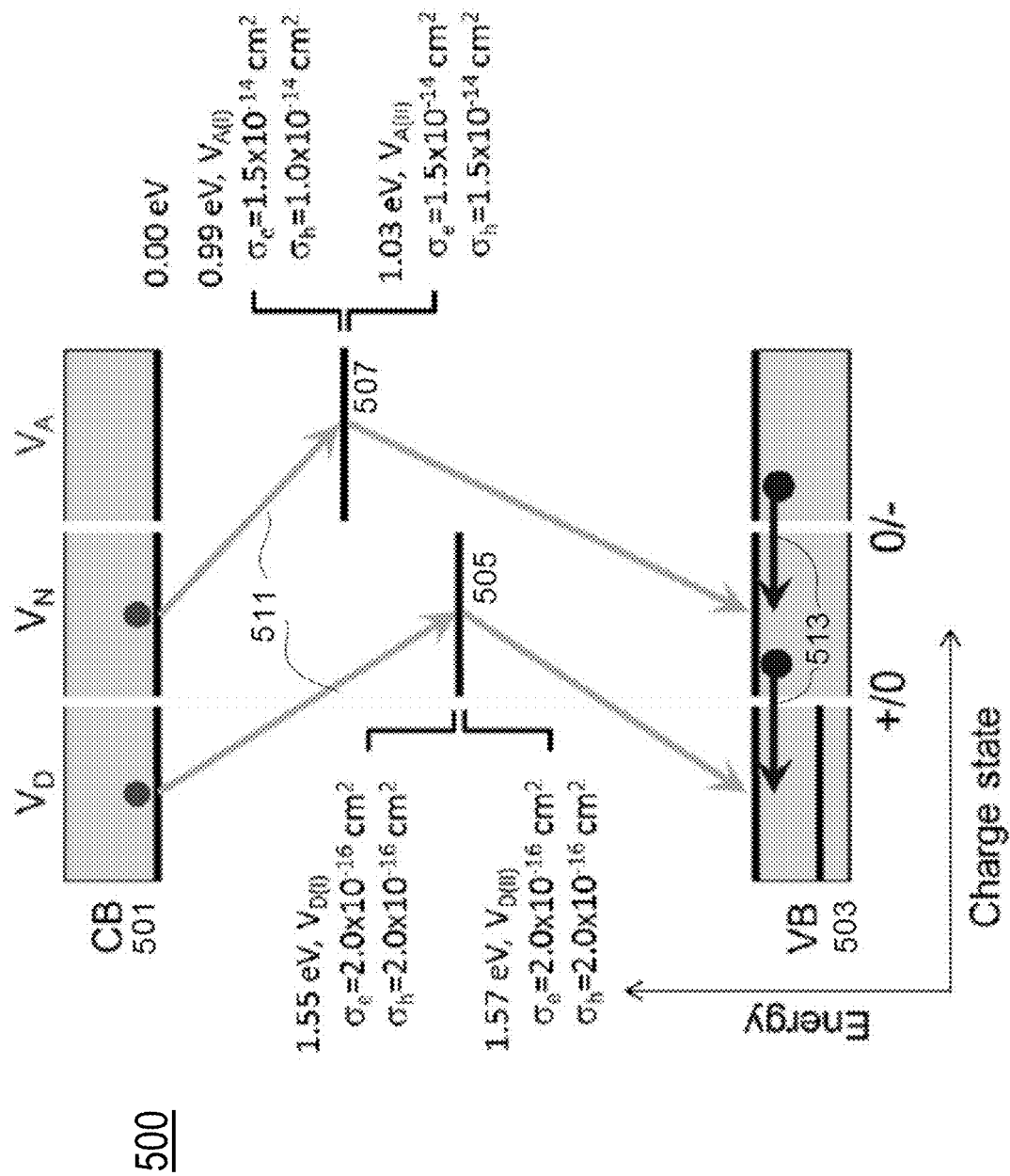
FIG. 5A shows a schematic diagram demonstrating an example bandgap structure in Vanadium doped silicon carbide.
Figure 5B:
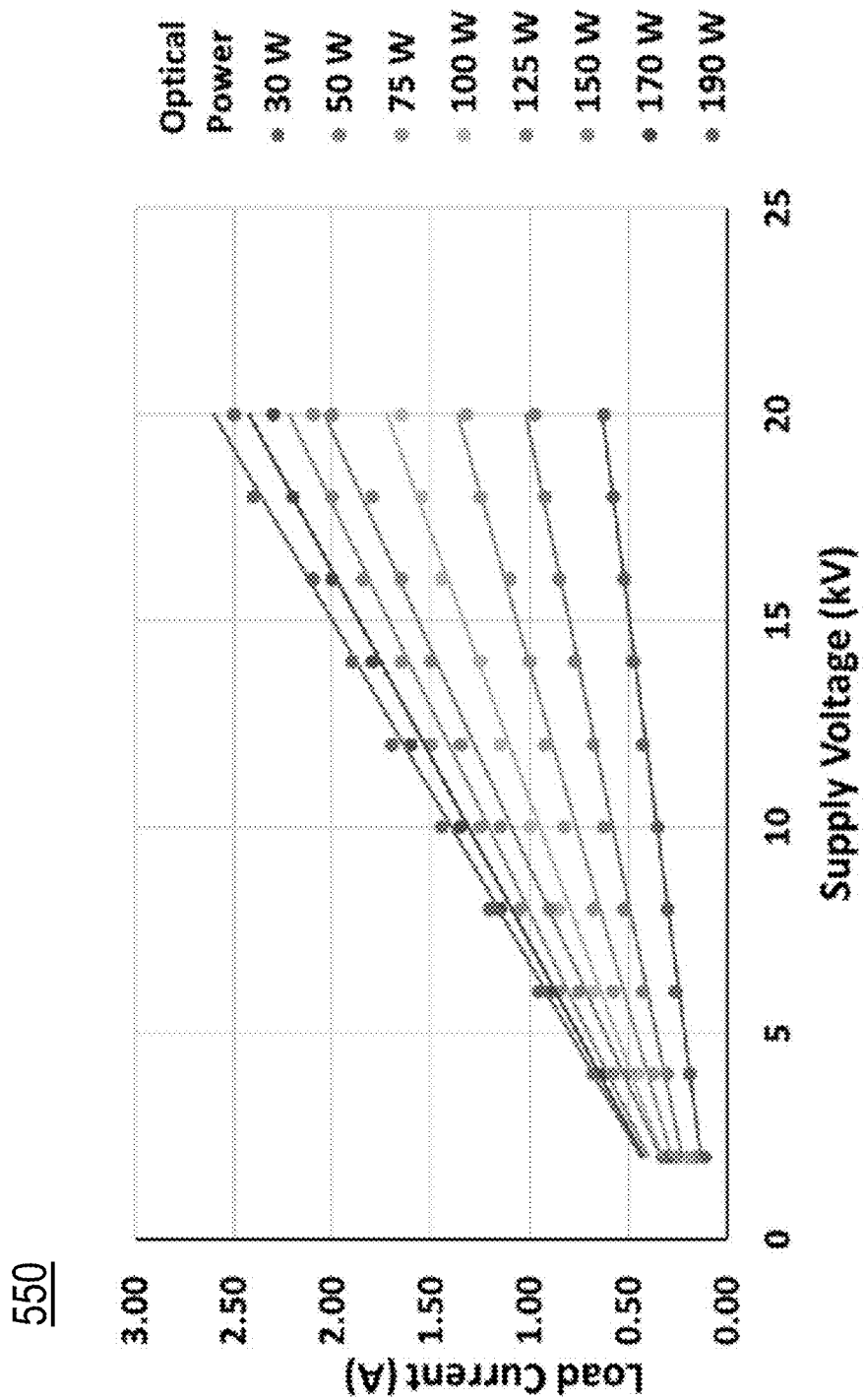
FIG. 5B shows example plots demonstrating the transconductance property and linearity of optical switch implementations in one or more embodiments of the present technology.

In other words, the photoconductive material exhibits a linear transconductance-like property with an optical excitation when the recombination time, $\tau$, is small (e.g., around or below 1 ns) compared to the characteristic time of the highest frequency components of the electrical signal controlling the light source (e.g., around 10 ns in power electronics). FIG. 5A shows a schematic diagram demonstrating an exemplary bandgap structure in Vanadium doped silicon carbide. FIG. 5A depicts the conduction band (CB) 501 and valance band (VB) 503. Two mid-gap states 505 and 507 (e.g., Vanadium sites) within the band gap have been observed. During excitation, Vanadium sites 505 and 507 become effective recombination centers. By imposing the conditions of energy and charge conservation, the allowable transitions for electrons as charge carriers (511) and holes as charge carriers (513) are shown. FIG. 5B shows example plots demonstrating the transconductance property and linearity of optical switch implementations in one or more embodiments of the present technology. The recombination time, τ, for this particular set of data was approximately 1 ns and the equivalent time of the applied signal exceeded 10 ns. Varying the light intensity as $\xi_{in}'$ on the x-axis leads to the current variation on the y-axis for a given voltage across the device.

Therefore, the photoconductive component exhibits transconductance control capability similar to a MOSFET. The optical nature of the photoconductive component, however, makes it immune to external electrons or magnetic fields and enable it to be electrically isolated and stackable with other circuit components. As a result, the need for large isolation space required by conventional DC circuit breakers is eliminated and the size of the circuit breaker systems are greatly reduced. In one example embodiment, the size of the combination of the mechanical circuit breaker and the photoconductive component is reduced to around the size of a refrigerator. For example, a conventional circuit breaker design for 180 kV High-Voltage Direct Current (HVDC) transmission lines incorporates 40 IGBT modules in series, as each IGBT module is only rated for 4.5 kV. A representative IGBT module has a volume of around 1025 $cm^3$, resulting in a total volume of more than 41,000 $cm^3$. The total cost of the IGBT modules is greater than $150,000. Using the techniques disclosed herein, an example OTV module can be 1800 $cm^3$ in volume and only 5 OTV modules are required in series. The total volume of switching devices can be reduced by over 75% to around 9,000 $cm^3$. The total cost of the example OTV modules can be around $25,000, a reduction of costs by over 80%. With fewer semiconductor modules required, there is a corresponding reduction in the number and size of other system components as well. Use of the OTV in place of semiconductor devices such as IGBT modules reduces DC Circuit Breaker size by at least 50%.

Furthermore, unlike conventional circuit breakers that require two stacks to break the current in both directions (because one stack is only capable of breaking the current in one direction), the control of bi-directional circuit breakers can be achieved a single photoconductive component in the disclosed embodiments.

Figure 6:
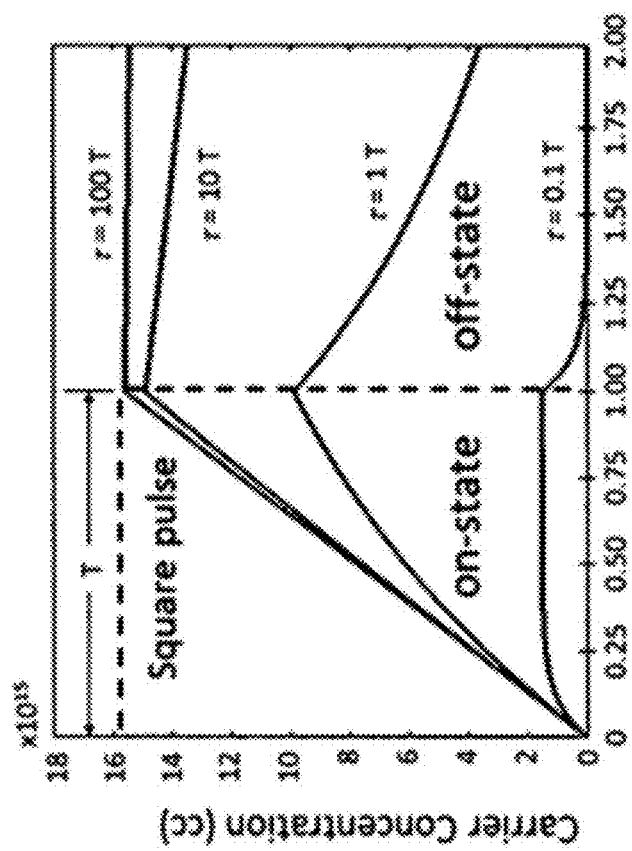
FIG. 6 illustrates examples of the photonic control responses given a square pulse in accordance with one or more embodiments of the present technology.

In some embodiments, to deliver higher peak power to the photoconductive component, a pulsed laser can be used. FIG. 6 illustrates an example of the photonic control response achieved by one or more embodiments of the present technology. As shown in FIG. 6, an input square pulse of duration T is used to optically excite the carriers from the valance band or deep levels within the bandgap. Once excited, the carriers decay according to Shockley-Read-Hall (SRH) with a recombination time, τ (see Eq. (2)). For a rectangular or square laser pulse and a short recombination time, the carrier concentration is low, but the fidelity is high. Conversely, for a long recombination time, the carrier concentration is high and the fidelity is low. Therefore, the design and optimization of the photoconductive component can be determined based on the balance between the optical power and pulse fidelity.

Figure 7:
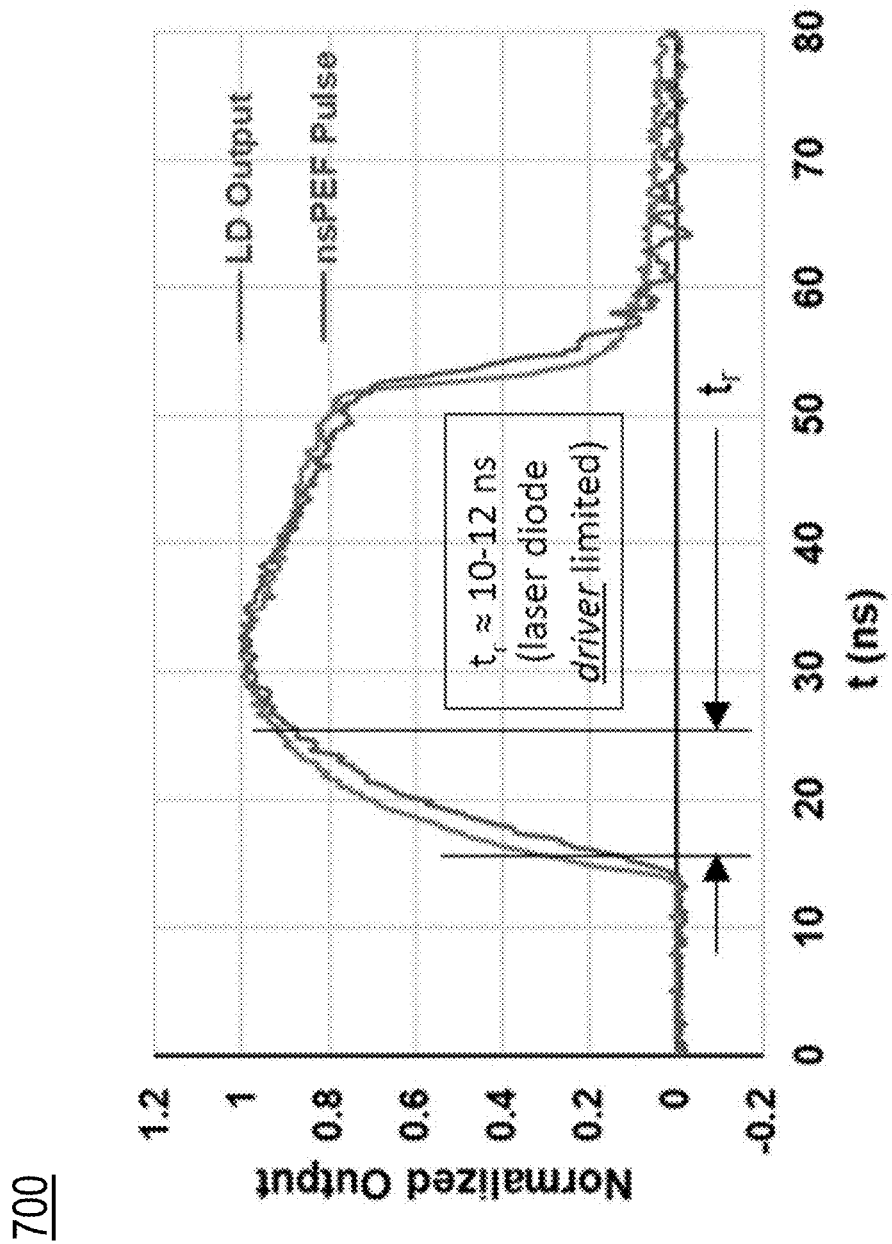
FIG. 7 illustrates an example of output pulse demonstrating the risetime of a photoconductive component in accordance with one or more embodiments of the present technology.
Figure 8:
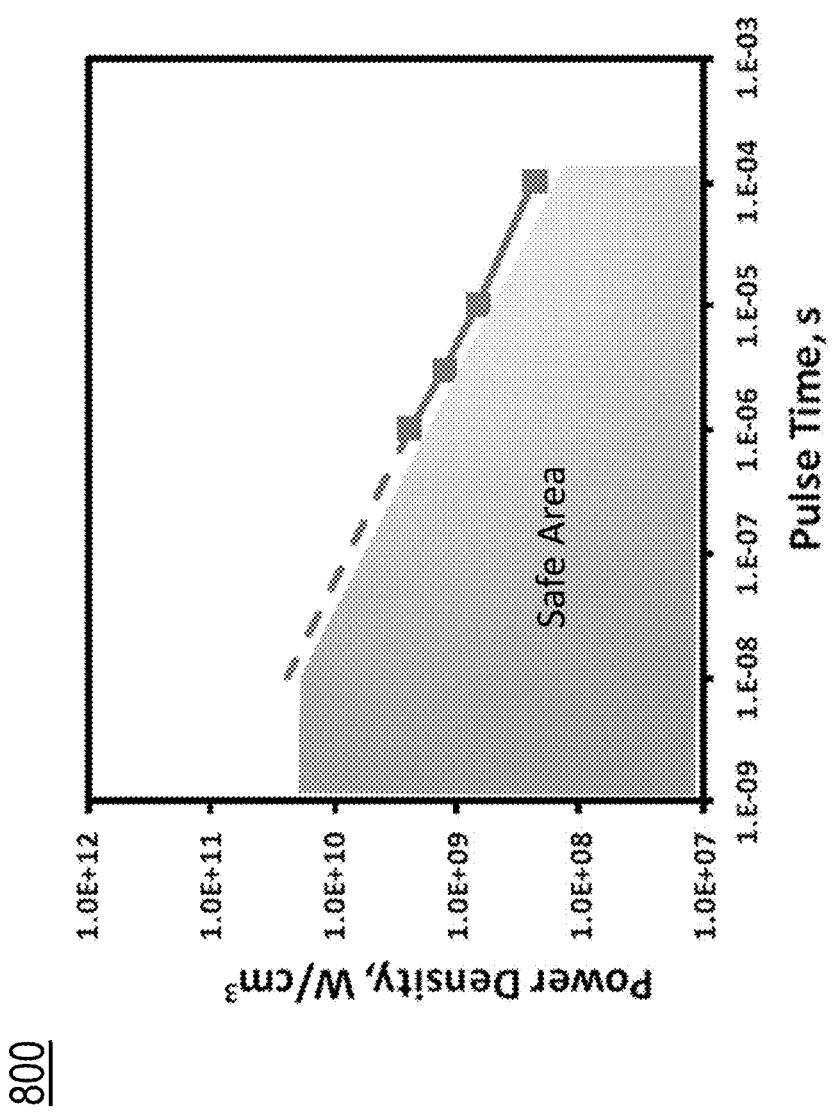
FIG. 8 illustrates an example plot developed to show different lengths of pulse time and the corresponding power density that can be used as a guideline for determining pulse time and peak current in accordance with one or more embodiments of the present technology.

As discussed above, when the recombination time is small as compared to the characteristic time of the highest frequency components of the electrical signal controlling the light source, the risetime of the photoconductive component is limited by the characteristic time of highest frequency components (e.g., the laser diode). FIG. 7 illustrates that, given carrier excitation of less than 70 femtoseconds, the risetime $t_r$ can be around 10-12 ns (limited by the laser diode driver). The intrinsic risetime $t_{sw} \sim [t_{total}^2 - t_{LD}^2]^{1/2}$ can in fact be as low as around 5 ns. The peak current that the photoconductive component can handle can be determined by Joule heating. FIG. 8 illustrates an example plot developed to show different lengths of pulse time and the corresponding power density, which can be used as a guideline for determining pulse time and peak current in accordance with one or more embodiments of the present technology. In some implementations, a pulse time of between $10^{-8}$ to $10^{-4}$ second (e.g., 25 μs) for the laser pulse can achieve reliable operation at around 10 $kA/cm^2$ or higher. The substrate used in an example OTV design can accommodate over 5 kA in a 10-20 microsecond pulse. It is desirable to interrupt a fault in this time frame that is shorter than existing HVDC breakers in order to reduce damage to the system caused by excessive current and power transients. Higher currents can be accommodated by increasing the substrate volume. A substrate able to handle 15 kA can be less than 0.5 $cm^3$ and can be easily accommodated using the OTV module volume implemented using techniques disclosed herein.

Figure 9:
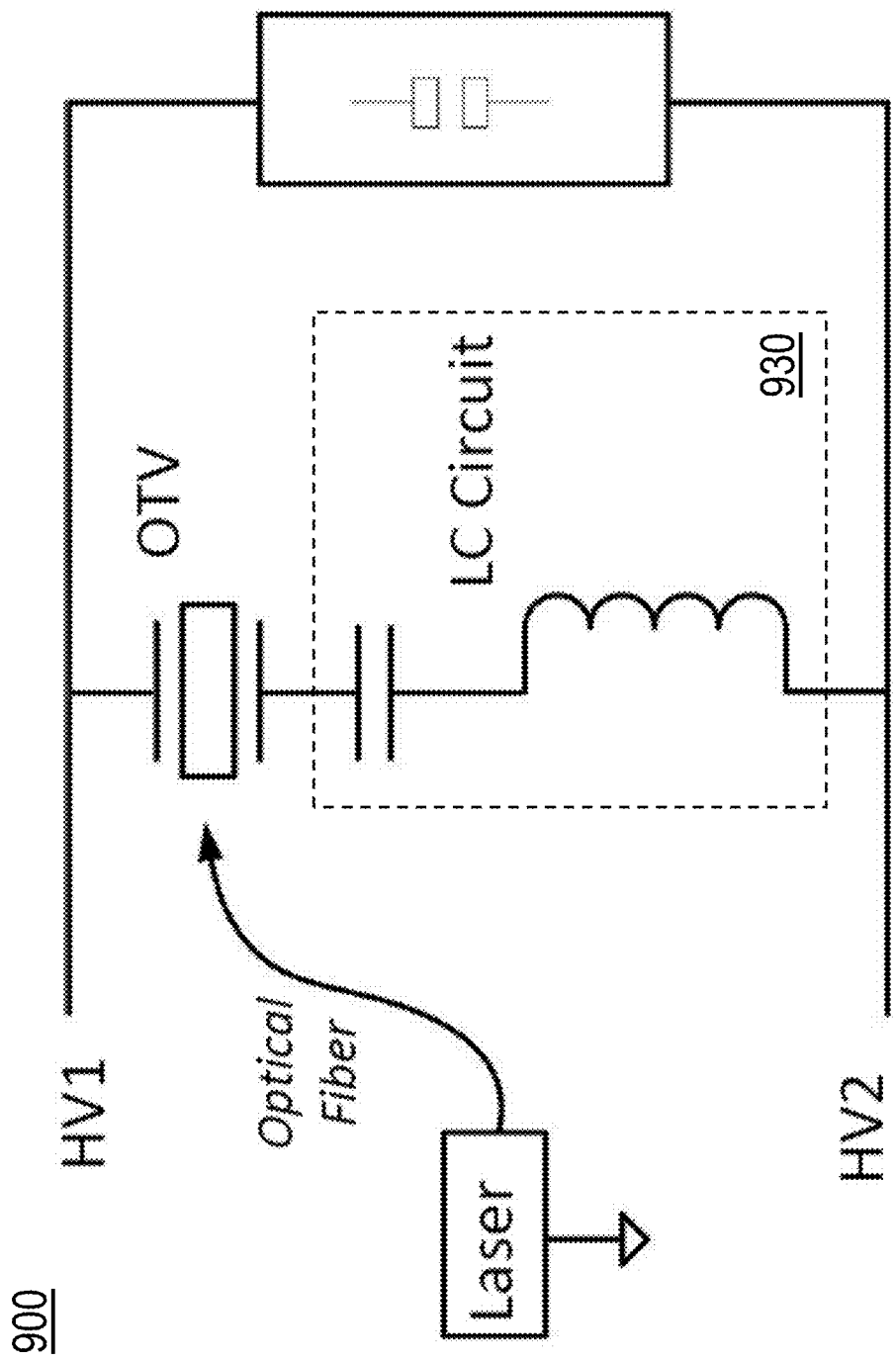
FIG. 9 illustrates an example configuration that includes a resonant circuit in accordance with one or more embodiments of the present technology.
Figure 10:
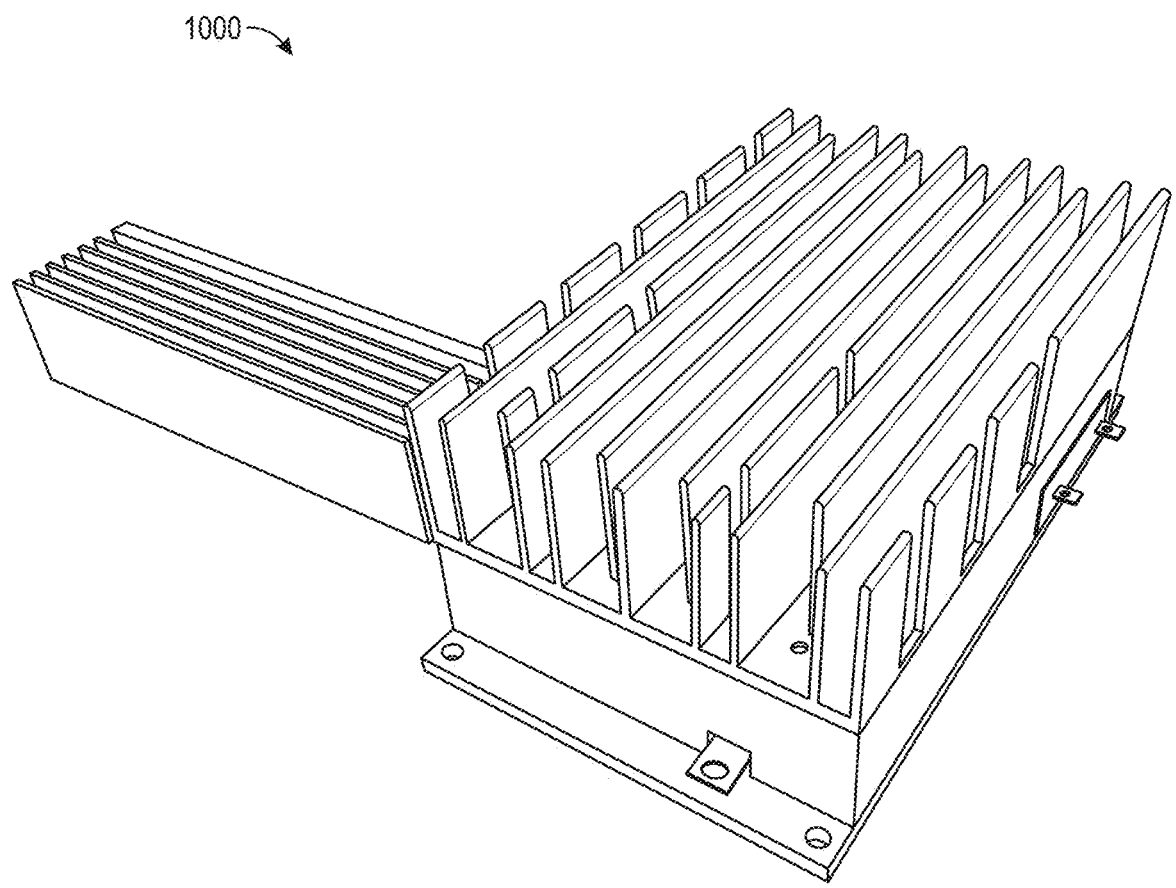
FIG. 10 illustrates an example of a photoconductive component with a convective cooling configuration in accordance with one or more embodiments of the present technology.

In some embodiments, a passive network, such as a resonant circuit, can be used in combination with the photoconductive component. FIG. 9 illustrates an example configuration that includes a resonant circuit in accordance with one or more embodiments of the present technology. The resonant circuit 930 can be used for energy storage (e.g., for reverse current generation). The photoconductive component and the resonant circuit are combined with the mechanical circuit breaker for breaking ultra-high, high, and medium voltage DC circuits. In some embodiments, the photoconductive device can be designed to work with a convective cooling configuration. An example cooling configuration is shown in FIG. 10, in which the convective cooling effectively dissipates the heat generated during operation (e.g., for continuous operations or operations using various duty cycles) and eliminates the need for additional space within the component for heat dissipation, thereby significantly reducing the size of the component.

Figure 11:
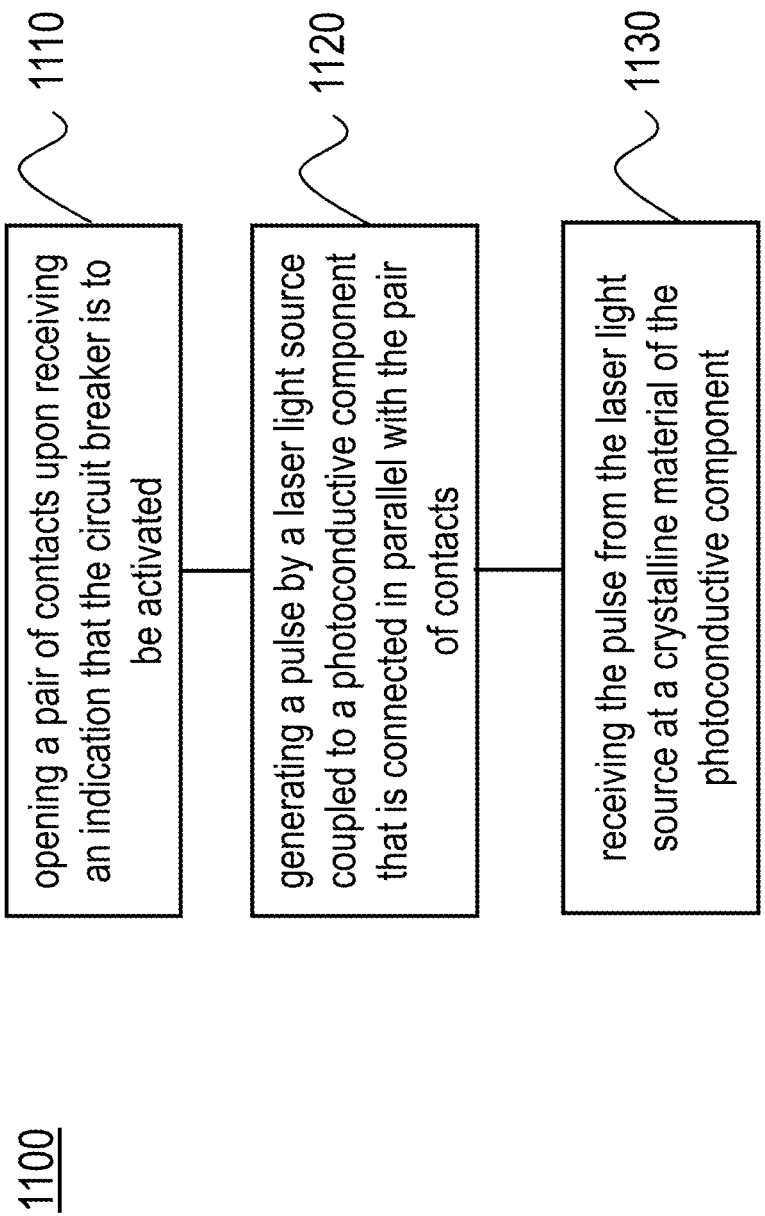
FIG. 11 is a flowchart representation for a method for interrupting a fault current in accordance with one or more embodiments of the present technology.

FIG. 11 is a flowchart representation for a method for operating a DC circuit breaker in accordance with one or more embodiments of the present technology. The method 1100 includes, at operation 1110, opening a pair of contacts upon receiving an indication that the circuit breaker is to be activated. The method 1100 includes, at operation 1120, generating a pulse by a laser light source coupled to a photoconductive component that is connected in parallel with the pair of contacts. The method 1100 includes, at operation 1130, receiving the pulse from the laser light source at a crystalline material of the photoconductive component. The crystalline material is coupled to a pair of electrodes to allow an electric field to be established across the crystalline material upon receiving the pulse, and wherein the crystalline material is doped with a dopant that forms a mid-gap state within a bandgap of the crystalline material to achieve, upon excitation of the crystalline material by the pulsed light signal, a recombination time that is at least one order of magnitude smaller than a characteristic time of a highest frequency component of an electrical signal controlling the laser light source. Upon receiving the pulse by crystalline material, at least part of a current that flows through the electrical circuitry to flow through the photoconductive component.

In some example embodiments, the receiving of the pulse includes receiving the pulse via an optical fiber positioned coupled to the laser light source and to the crystalline material. In another example embodiment, the generating of the pulse light includes emitting, by the laser light source, a pulsed laser signal having a pulse width between $10^{-6}$ to $10^{-4}$ seconds. In one example embodiment, the pulsed laser signal is a square pulse or a rectangular laser pulse. In yet another example embodiment, the mechanical switch includes one of a rod array vacuum breaker, a non-rod array breaker a series saturable reactor, or a combination thereof. In still another example embodiment, the current that flows through photoconductive component flows in either direction parallel to the pair of contacts. According to one example embodiment, the above noted method further includes storing energy in a resonant circuit connected to the photoconductive component, wherein the resonant circuit is configured to generate a reverse current in response to activation of the circuit breaker. In one example embodiment, the photoconductive component is configured as a stackable component with at least one of the pair of contacts or the resonant circuit. In another example embodiment, the above noted method includes dissipating heat generated by photoconductive component by a convective cooling configuration attached to the photoconductive component.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described, and other implementations, enhancements and variations can be made based on what is described and illustrated in this patent document.

What is claimed is:

1. An apparatus of a direct current (DC) circuit breaker operable to interrupt a current flow in an electrical circuit, the DC circuit breaker comprising:
    a mechanical switch including a pair of contacts configured to be positioned apart upon activation of the DC circuit breaker; and
    one or more photoconductive components, each having a volume that is capable of handling a peak current of over 5 kA, wherein the one or more photoconductive components are in parallel with the mechanical switch, wherein the one or more photoconductive components are configured to establish a current upon activation of the DC circuit breaker, and wherein each of the one or more photoconductive components comprises:
        a crystalline material positioned to receive a pulsed light signal having a pulse width of 10-20 µs from a light source, wherein the crystalline material is doped with a dopant that forms two or more mid-gap states within a bandgap of the crystalline material to achieve, upon excitation of the crystalline material by the pulsed light signal, a recombination time that is at least one order of magnitude smaller than a characteristic time of a highest frequency component of an electrical signal controlling the light source such that the crystalline material exhibits a substantially linear transconductance in response to the light source; and
        a pair of electrodes coupled to the crystalline material and configured to allow an electric field to be established across the crystalline material to generate the current,
    wherein a total volume of the one or more photoconductive components is around 9,000 cm$^3$.

2. The apparatus of claim 1, wherein each of the one or more photoconductive components further includes an optical fiber between the light source and the crystalline material.

3. The apparatus of claim 1, wherein the DC circuit breaker includes a laser configured to produce the pulsed light signal that comprises a square pulse or a rectangular pulse.

4. The apparatus of claim 1, wherein the mechanical switch is configured to diffuse discharge caused by a fault current.

5. The apparatus of claim 4, wherein the mechanical switch comprises one of a rod array vacuum breaker, a non-rod array breaker, a series saturable reactor, or a combination thereof.

6. The apparatus of claim 1, wherein the one or more photoconductive components are configured to establish the current in both directions parallel to the pair of contacts.

7. The apparatus of claim 1, further comprising a resonant circuit configured to store energy to enable generation of the current upon the electric field being established across the crystalline material, wherein the resonant circuit includes at least an inductor and a capacitor.

8. The apparatus of claim 7, wherein the one or more photoconductive components are configured to be stackable with at least one of the pair of contacts or the resonant circuit.

9. The apparatus of claim 1, further comprising a convective cooling configuration coupled to the one or more photoconductive components and configured to dissipate heat generated from the one or more photoconductive components.

10. A method for operating a circuit breaker that is part of an electrical circuitry, comprising:
    opening a pair of contacts upon receiving an indication that the circuit breaker is to be activated;
    generating a pulsed light signal having a pulse width of 10-20 µs by a laser light source coupled to one or more photoconductive components, each having a volume that is capable of handling a peak current of over 5 kA, wherein the one or more photoconductive components are connected in parallel with the pair of contacts; and
    receiving, at a crystalline material of each of the one or more photoconductive components, the pulsed light signal from the laser light source, wherein the crystalline material is coupled to a pair of electrodes to allow an electric field to be established across the crystalline material upon receiving the pulsed light signal, and wherein the crystalline material is doped with a dopant that forms two or more mid-gap states within a bandgap of the crystalline material to achieve, upon excitation of the crystalline material by the pulsed light signal, a recombination time that is at least one order of magnitude smaller than a characteristic time of a highest frequency component of an electrical signal controlling the laser light source such that the crystalline material exhibits a substantially linear transconductance in response to the pulsed light signal, and wherein upon receiving the pulsed light signal by the crystalline material, at least part of a current that flows through the electrical circuitry to flow through the one or more photoconductive components.

11. The method of claim 10, wherein the receiving of the pulsed light signal includes receiving the pulsed light signal via an optical fiber positioned coupled to the laser light source and to the crystalline material.

12. The method of claim 10, wherein the pulsed light signal is a square pulse or a rectangular laser pulse.

13. The method of claim 10, wherein the pair of contacts forms a mechanical switch, and wherein the mechanical switch comprises one of a rod array vacuum breaker, a non-rod array breaker a series saturable reactor, or a combination thereof.

14. The method of claim 10, wherein the current that flows through the one or more photoconductive components flows in either direction parallel to the pair of contacts.

15. The method of claim 10, further comprising:
storing energy in a resonant circuit connected to the one or more photoconductive components, wherein the resonant circuit is configured to generate a reverse current in response to activation of the circuit breaker.

16. The method of claim 15, wherein the one or more photoconductive components are configured as a stackable component with at least one of the pair of contacts or the resonant circuit.

17. The method of claim 10, further comprising:
dissipating heat generated by the one or more photoconductive components by a convective cooling configuration attached to the one or more photoconductive components.

* * * * *